United States Patent
Chujo et al.

(10) Patent No.: US 6,404,100 B1
(45) Date of Patent: Jun. 11, 2002

(54) SURFACE ACOUSTIC WAVE APPARATUS AND METHOD OF MANUFACTURING THE SAME

(75) Inventors: Rieko Chujo; Masayoshi Koshino, both of Tokyo; Kaoru Sakinada, Asahikawa, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/419,610

(22) Filed: Oct. 18, 1999

(51) Int. Cl.⁷ ................................ H03H 9/00
(52) U.S. Cl. ....................... 310/313 R; 310/348
(58) Field of Search ................ 310/313 R, 348, 310/344, 313 BD

(56) References Cited

U.S. PATENT DOCUMENTS 5,459,368 A * 10/1995 Onishi et al. ............ 310/313 R
5,471,722 A * 12/1995 Yatsuda ..................... 29/25.35
5,699,027 A * 12/1997 Tsuji et al. ............... 310/313 R
5,821,665 A * 10/1998 Onishi et al. ............ 310/313 R

FOREIGN PATENT DOCUMENTS

JP          8-191181          7/1996

* cited by examiner

Primary Examiner—Nestor Ramirez
Assistant Examiner—Karen Addison
(74) Attorney, Agent, or Firm—Oblon, Spivak, McClelland, Maier & Neustadt, P.C.

(57) ABSTRACT

A surface acoustic wave apparatus includes a package having a concave-shaped base and a concave-shaped cap and a surface acoustic wave element housed in the package. The base has a mounting surface on which the surface acoustic wave element is mounted and a side wall raised from the periphery of the mounting surface. The side wall of the base is formed lower than the highest part of the surface acoustic wave element mounted on the mounting surface. Since the surface acoustic wave element mounted on the base is raised above the side wall of the base, the surface acoustic wave element is subjected easily to, for example, test, measurement, fault analysis, and others.

10 Claims, 2 Drawing Sheets

SURFACE ACOUSTIC WAVE APPARATUS AND METHOD OF MANUFACTURING THE SAME

BACKGROUND OF THE INVENTION

This invention relates to a surface acoustic wave apparatus constructed by sealing a chip-shaped surface acoustic wave element into a package and a method of manufacturing the surface acoustic wave device.

As is generally known, the face-down bonding technique has been put to practical use as one of the techniques for putting various chip-shaped electronic part elements, including semiconductor elements, into a package or the like.

The face-down bonding technique is a packaging technique where the connection terminals provided on a package are connected to the connection terminals of an electrode pattern provided on one surface of the chip element by means of conductive bumps. The term face-down bonding comes from the fact that the surface on which the electrode pattern of the chip element has been formed is caused to face the package.

A surface acoustic wave apparatus, which is constructed by applying the face-down bonding technique to surface acoustic wave elements of chip-shaped electronic part elements, has been available in various configurations shown in FIGS. 4 to 7.

FIG. 4 shows a configuration where the electrode pattern 3a of a surface acoustic wave element 3 is face-down bonded to the mounting surface 1a of the concave-shaped base 1 via conductive bumps 2 and then a flat-plate-like cap 4 is put on the base 1.

FIG. 5 shows a configuration where the electrode pattern 3a of a surface acoustic wave element 3 is face-down bonded to the mounting surface 1a of the concave-shaped base 1 via conductive bumps 2 and then a concave-shaped cap 4 is put on the base 1.

FIG. 6 shows a configuration where the electrode pattern 3a of a surface acoustic wave element 3 is face-down bonded to the mounting surface 1a of the flat-plate-like base 1 via conductive bumps 2 and then a concave-shaped cap 4 is put on the base 1.

FIG. 7 shows a configuration where the electrode pattern 3a of a surface acoustic wave element 3 is face-down bonded to the mounting surface 1a of the flat-plate-like base 1 via conductive bumps 2 and then the surface acoustic wave element 3 is resin-sealed with a cap 4 made of mold resin.

In recent years, surface acoustic wave apparatuses, particularly mobile radio communication filters, have been required to have a low-loss, high-attenuation frequency characteristic. Additionally, as the apparatuses have been getting smaller, the filter parts have also been required to decrease in size.

In addition to this, for example, in cellular phones or the like, a very large number of parts have been used and each part has been required to keep a high quality level. They have particularly been required to have a high reliability under the mechanical stress of impact, falling, vibration, or the like, or the thermal stress of temperature changes (widening the using temperature range).

However, with the configurations of the conventional surface acoustic wave apparatuses shown in FIGS. 4 and 5, since the surface acoustic wave element 3 is housed inside the concave-shaped base 1 and the top surface of the surface acoustic wave element 1 is located lower than the top surface of the base 1, this causes the following problems.

First, in a die shear strength test by which the junction of the conductive bumps 2 is checked by pressing the surface acoustic wave element 3 sideways along the mounting surface 1a of the base 1, the clearance between the side face of the surface acoustic wave element 3 and the inner wall surface of the base 1 is so narrow that it is difficult to insert a test jig for pressing the surface acoustic wave element 3 into the clearance, which makes the examination difficult.

Furthermore, when the surface acoustic wave element 3 is removed from the base 1 and fault analysis is performed, the clearance between the side face of the surface acoustic wave element 3 and the inner wall surface is so narrow that it is difficult to insert tweezers for taking out the surface acoustic wave element 3 into the clearance, which makes it difficult to take the surface acoustic wave element 3 out of the base 1. This makes the fault analysis difficult.

Additionally, when the surface acoustic wave element 3 is mounted on the base 1, the sucker of a collect is caused to adhere to the surface acoustic wave element 3 by suction and the element 3 is inserted into the base 1. Because the sucker of the collect also needs to go into the inside of the base 1 when the surface acoustic wave element 3 is inserted into the inside of the base 1, only the sucker of the collect narrower than the inner length, or width, of the base 1 can be used.

In the examination, measurement, or fault analysis described above, because only the sucker of the collect narrower than the inner length, or width, of the base 1 can be used, excessive force can be exerted on the surface acoustic wave element 3, which is therefore liable to break.

Since the conventional surface acoustic wave apparatus shown in FIG. 6 uses the flat-plate-like base 1, the following problems arise: when the base 1 is joined to the cap 4 with solder or adhesive, the solder or adhesive squeezed from between the base 1 and the cap 4 is liable to flow toward the conductive bumps 2.

Furthermore, since the mounting surface 1a to which the conductive bumps 2 are connected and metallize are formed on the same surface of the flat-plate-like base 1, the flatness of the metallize joined to the cap 4 is degraded, which causes a hermetic sealing problem. In addition, because the base 1 takes the form of a flat plate, alignment is difficult when the base is jointed to the cap 4.

The conventional surface acoustic wave apparatus shown in FIG. 7 has not only the problem caused by the configuration of the surface acoustic wave apparatus of FIG. 6 but also an aging problem. Specifically, since the stress of mold resin is exerted on the surface acoustic wave element 3, the stress makes the surface acoustic wave element 3 liable to age.

BRIEF SUMMARY OF THE INVENTION

It is, accordingly, an object of the present invention to overcome the above problems by providing not only a high-quality surface acoustic wave apparatus which enables a surface acoustic wave element mounted on the base to be subjected easily to such processes as examination, measurement, and fault analysis, but also a method of manufacturing the same.

A surface acoustic wave apparatus according to the present invention comprises a surface acoustic wave element, a base having a mounting surface on which the surface acoustic wave element is mounted and a side wall surrounding the surface acoustic wave element, and a cap so joined to the base that it covers the surface acoustic wave element, wherein the side wall of the base is formed lower than the highest part of the surface acoustic wave element.

With the above configuration, because the side wall of the base is formed lower than the highest part of the surface acoustic wave element mounted on the mounting surface, that is, because the highest part of the surface acoustic wave element mounted on the mounting surface is raised above the side wall of the base, the surface acoustic wave element mounted on the base can be subjected easily to, for example, examination, measurement, fault analysis, and others. Therefore, it is possible to provide a high-quality surface acoustic wave apparatus.

The base is composed of an almost flat-plate-like base body with a mounting surface on which the surface acoustic wave element is mounted and a frame member so provided on the mounting surface of the base body that it surrounds the surface acoustic wave element. The height of the side wall can be set easily by selecting the frame member.

The frame member is constructed by stacking plural frame member layers. The height of the wall surface can be set easily by selecting the number of frame member layers or a combination of frame member layers differing in thickness.

The cap is formed into an almost concave shape and joined to the frame member of the base by using the portions projecting from the side wall of the base of the surface acoustic wave element as a guide, thereby housing the surface acoustic wave element together with the base. The positioning for junction can be done easily using the portions projecting upward from the side wall of the base as a guide.

The difference in height between the height of the side wall of the base and the highest part of the surface acoustic wave element mounted on the mounting surface of the base is set at about 50 $\mu$m or more. This makes it possible to easily engage, for example, a test jig or the like with the portions projecting upward above the side wall of the base for examination. Thus, the setting is practical.

The surface acoustic wave element has one surface on which an electrode pattern is formed and is mounted in such a manner that the electrode-pattern-formed surface faces the mounting surface of the base. This enables face-down bonding.

The electrode pattern of the surface acoustic wave element is connected electrically to the mounting surface of the base via conductive bumps. This enables the surface acoustic wave element to be mounted easily.

A method of manufacturing surface acoustic wave apparatus according to the present invention comprises the step of, when a cap is jointed to a base having a mounting surface on which a surface acoustic wave element is mounted and a side wall surrounding the surface acoustic wave element in such a manner that it covers the surface acoustic wave element, making the side wall of the base lower than the highest part of the surface acoustic wave element mounted on the mounting surface.

With this method, because the side wall of the base is formed lower than the highest part of the surface acoustic wave element mounted on the mounting surface, that is, because the highest part of the surface acoustic wave element mounted on the mounting surface is raised above the side wall of the base, the surface acoustic wave element mounted on the base can be subjected easily to, for example, examination, measurement, fault analysis, and others. Therefore, it is possible to provide a method of manufacturing high-quality surface acoustic wave apparatuses.

The base is composed of an almost flat-plate-like base body with a mounting surface on which the surface acoustic wave element is mounted and a frame member so provided on the mounting surface of the base body that plural frame member layers are stacked so as to surround the surface acoustic wave element and that the height of the side wall of the base is set by stacking the frame member layers. This enables the height of the side wall to be set easily by selecting the number of frame member layers or a combination of frame member layers differing in thickness.

Furthermore, when cap is joined to the base, the positioning is done using the portions projecting from the side wall of the base of the surface acoustic wave element as a guide. This enables the cap to be joined to the base easily.

DETAILED DESCRIPTION OF THE INVENTION

Figure 1:
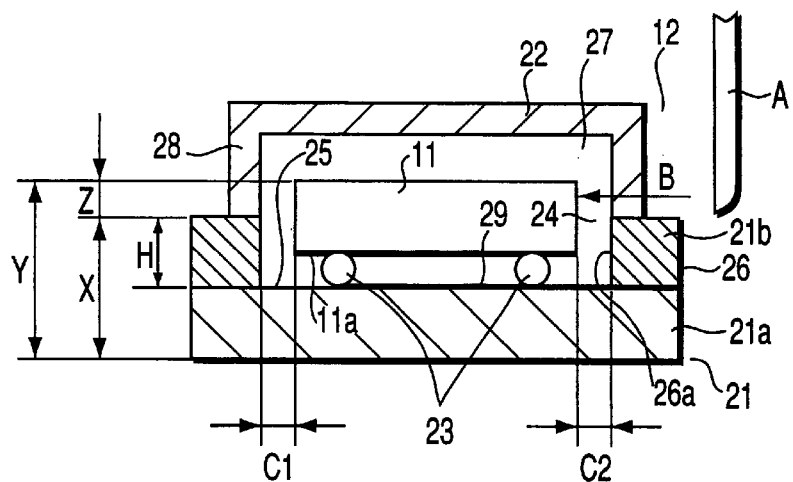
FIG. 1 is a sectional view to help explain an embodiment of a surface acoustic wave apparatus according to the present invention.

Hereinafter, referring to the accompanying drawings, an embodiment of the present invention will be explained in detail. FIG. 1 is a sectional view of a surface acoustic wave apparatus which will be explained in the embodiment. The surface acoustic wave apparatus of FIG. 1 comprises a surface acoustic wave element 11 and a package 12 for housing the surface acoustic wave element 11.

The surface acoustic wave element 11 is a chip-like substrate, on one surface of which an electrode pattern 11*a* is formed.

The package 12 is composed of a concave-shaped base 21 and a concave-shaped cap 22. The surface acoustic wave element 11 is connected electrically to the base 21 via conductive bumps 23.

The base 21 is made of, for example, insulative ceramic or plastic. The base 21 is composed of an almost flat-plate-like base body 21*a* and an almost square frame member 21*b* secured to the periphery of the top surface of the base body 21*a* in the figure.

In the base 21, the base body 21*a* and frame member 21*b* form a recessed section 24 for housing the surface acoustic wave element 11 in the central area of the top surface in the figure.

Additionally, in the base 21, a mounting surface 25 on which the surface acoustic wave element 11 is mounted is formed on the bottom surface of the recessed section 24, that is, in the central area of the top surface of the base body 21*a* in the figure. Moreover, in the base 21, a wall 26*a* raised from the periphery of the mounting surface 25 is formed on the inner sidewall of the frame member 21*b*.

The frame member 21*b* constitutes an almost square-frame-like wall section 26 raised from the periphery of the base body 21a. While in FIG. 1, the height of the wall section 26, that is, the rising height of the wall 26a, is set with the one-layer (one-stage) frame member 21b, the height may be set with a structure where plural frame member layers are stacked, which will be explained later.

An electrode section to which the surface acoustic wave element 11 is connected electrically via conductive bumps 23 is formed on the mounting surface 25. On the mounting surface 25, a metallized wire 29 is formed which is connected to the electrode section, passes through between the base body 21a and the frame member 21b and is drawn out of the base 21.

The height X of the wall section 26 from the bottom surface of the base 21 is so set that the height X is smaller than the height Y from the bottom surface of the base 21 to the top surface (the highest part) of the surface acoustic wave element 11 mounted on the mounting surface 25 in the figure. Namely, the wall 26a (frame member 21b) is so formed that the rising height H of the wall 26a is smaller than the highest part of the surface acoustic wave element 11 mounted on the mounting surface 25.

On the other hand, the cap 22 is made of, for example, insulative ceramic or plastic. In the cap 22, a recessed section 27 for housing the surface acoustic wave element 11 is formed in the central area of the bottom surface in the figure. A wall section 28 joined to the top surface of the wall section 26 of base 21 in the figure is formed on the periphery of the bottom surface of the cap 22 in the figure.

In the process of assembling the surface acoustic wave apparatus, the electrode pattern 11a of the surface acoustic wave element 11 is face-down-bonded to the mounting surface 25 of the base 21 via the conductive bumps 23. At this time, the top surface of the surface acoustic wave element 11 is so mounted on the mounting surface 25 of the base 21 that the top surface is above the rising height of the wall 26a of the base 21.

Thereafter, the bottom surface of the wall section 28 of the cap 22 is caused to hermetically adhere to the top surface of the wall section 26 of the base 21 with adhesive. This enables the surface acoustic wave element 11 to be hermetically housed between the base 21 and cap 22.

When the cap 22 is stuck to the base 21, the cap 22 is aligned easily with a specific position of the base 21 by using as a guide the projecting portions of the surface acoustic wave element 11 mounted on the mounting surface 25, above the rising height of the wall 26a of the base 21.

In the surface acoustic wave apparatus, the height X of the wall section 26 of the base 21 is smaller than the height of the top surface of the surface acoustic wave element 11 mounted on the mounting surface 25. That is, the surface acoustic wave element 11 mounted on the base 21 is raised by the height difference Z from the rising height of the wall 26a of the base 21.

The wall 26a of the base 21 is so formed that the position of the rising height of the wall surface is lower than the highest part of the surface acoustic wave element 11 mounted on the mounting surface 25 of the base 21.

The height difference Z between the surface acoustic wave element 11 mounted on the mounting surface 25 of the base 21 and the wall 26a of the base 21 is set to such a value as allows a test jig A, such as tweezers, to engage with the side face of the surface acoustic wave element 11 using the height difference Z as shown by the arrow B in FIG. 1.

Specifically, in a die shear strength test where the surface acoustic wave element 11 is pressed sideways along the mounting surface 25 of the base 21 to check the junction of the conductive bumps 23 in the process of manufacturing the surface acoustic wave apparatus, even when the clearances C1, C2 between the side faces of the surface acoustic wave element 11 and the wall 26a of the base 21 are so narrow that it is difficult to insert the test jig for pressing the surface acoustic wave element 11 into the clearances, it is possible to easily press the side faces of the surface acoustic wave element 11 with the test jig, because the surface acoustic wave element 11 mounted on the mounting base 21 is raised by the height difference Z above the rising height of the wall 26a of the base 21. This facilitates the examination.

To mount the surface acoustic wave element 11 on the base 21, the sucker of the collect adheres to the surface acoustic wave element 11 by suction and goes into the inside of the base 21. Since the surface acoustic wave element 11 is mounted above the height of the wall 26a of the base 21, the sucker of the collect may be greater than the internal length or width of the base 21, widening the condition for flip chip bonding, which improves the manufacturing efficiency.

Furthermore, when the fault analysis of the surface acoustic wave apparatus is performed, the cap 22 is removed from the base 21 and the exposed surface acoustic wave element 11 is picked up with tweezers or the like and peeled from the base 21.

At that time, even if the lateral clearances C1, C2 between the base 21 and the surface acoustic wave element 11 are so narrow that it is impossible to insert tweezers into the clearances and pick up the surface acoustic wave element 11, the side faces of the surface acoustic wave element 11 can be picked up with tweezers or the like at both sides, because the surface acoustic wave element 11 mounted on the base 21 is raised by the height difference Z above the rising height of the wall 26a of the base 21. This enables the surface acoustic wave element 11 to be peeled off the base easily without excessive force.

Consequently, it is possible to prevent the surface acoustic wave element 11 from breaking, which often took place when the surface acoustic wave element was peeled off. This shortens the time required to perform the fault analysis.

In the aforementioned examination, measurement, and fault analysis, excessive force is not exerted on the surface acoustic wave element 11, because the sucker of the collect whose width is greater than the inner length or width of the base 21 can be used. This prevents the surface acoustic wave element from breaking.

In the surface acoustic wave apparatus of the embodiment, the height of the wall 26a raised from the periphery of the mounting surface 25 of the base 21 is smaller than that of the surface acoustic wave element 11 mounted on the mounting surface 25. Specifically, the surface acoustic wave element 11 mounted on the base 21 is raised above the wall 26a of the base 21, facilitating, for example, the examination, measurement, and fault analysis of the surface acoustic wave element 11 mounted on the base 21, which provides a high-quality surface acoustic wave apparatus.

The base 21 is composed of the almost flat-plate-like base body 21a having the mounting surface 25 on which the surface acoustic wave element 11 is mounted and the frame member 21b provided on the mounting surface 25 of the base body 21a so as to surround the side faces of the surface acoustic wave element 11. The rising height of the wall 26a can be set easily by selecting the frame member 21b.

Figure 2:
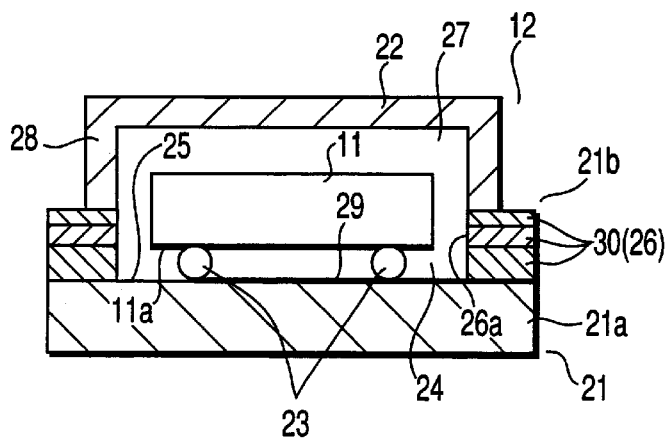
FIG. 2 is a sectional view to help explain another example of the frame member in the embodiment.

As shown in FIG. 2, the frame member 21b may be constructed by stacking plural (three in the figure) frame member layers 30 and sintering them. In this case, the height of the wall 26a can be set easily by, for example, changing the number of frame member layers 30 or combining several types of frame member layers 30 differing in thickness.

When the cap 22 is caused to adhere to the base 21, the portions projecting from the wall 26a of the base 21 of the surface acoustic wave element 11 function as a guide, which enables the cap 22 to be aligned easily with a specific position on the base 21 and caused to adhere thereto.

Since the wall 26a of the base 21 is so formed that it is lower than the highest part of the surface acoustic wave element 11 mounted on the mounted surface, use of the inside of the wall 26a of the base 21 enables the surface acoustic wave element 11 to be positioned on the mounting surface 25.

The height difference Z between the rising height of the wall 26a of the base 21 and the highest part of the surface acoustic wave element 11 mounted on the mounting surface 25 of the base 21 is set to a clearance that allows, for example, a test jig to engage with the side faces of the surface acoustic wave element 11 by using the height difference Z. This enables the jig to be engaged easily with the portions projecting from the wall 26a of the base 21 of the surface acoustic wave element 11 for examination or the like.

In this case, when the height difference Z between the rising height of the wall 26a of the base 21 and the highest part of the surface acoustic wave element 11 mounted on the mounting surface 25 of the base 21 is set at about 50 $\mu$m or more, it is practical.

In practice, for example, since in FIG. 1, H=250 $\mu$m and X=500 $\mu$m, the clearance between the mounting surface 25 and the surface acoustic wave element 11 that sandwich the conductive bumps 23 is 20 to 30 $\mu$m, and the thickness of the surface acoustic wave element 11 is 350 to 500 $\mu$m, this gives Y=630 to 780 $\mu$m and Z=130 to 280 $\mu$m. Taking into account the accuracy of present-day jigs and others, the setting of the height difference Z at about 50 $\mu$m or more is practical. Here, C1 and C2 are: C1, C2=100 $\mu$m.

Each of the base 21 and cap 22 is formed into a concave shape. The metallized wire 29 drawn out of the base 21 along the mounting surface 25 passes through between the base body 21a and frame member 21b, not over the junction surface of the base 21 and cap 22, or the top surface of the wall section 26. As a result, the flatness of the top surface of the wall section 26 of the base 21 is high and the reliability of hermetical sealing of the base 21 and cap 22 with adhesive is improved, which reduces leakage problems.

The distance between the junction of the base 21 and the cap 22 and the conductive bump 23 side is secured by forming each of the base 21 and cap 22 into a concave shape. This prevents the solder or adhesive squeezed from between the base 21 and cap 22 from flowing toward the conductive bump 23 side, when the base 21 is joined to the cap 22 with solder or adhesive.

Since no stress is exerted on the surface acoustic wave element 11 differently from a conventional mold resin cap, the aging of the surface acoustic wave element 11 can be alleviated.

Figure 3:
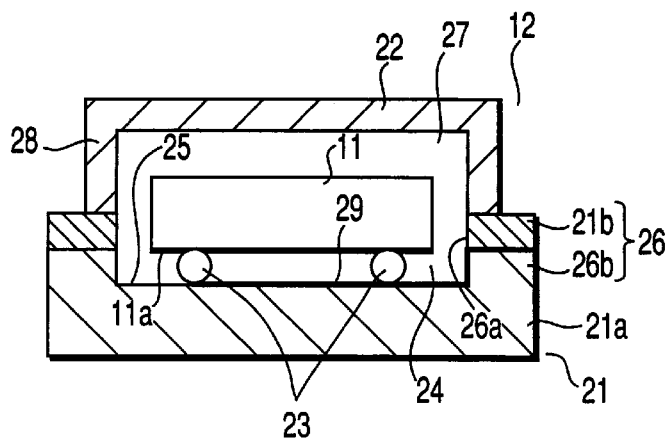
FIG. 3 is a sectional view to help explain a modification of the embodiment.
Figure 4:
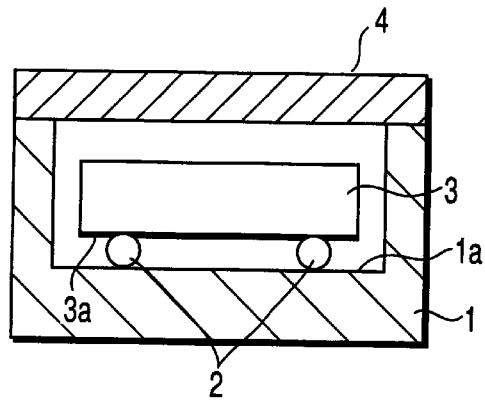
FIG. 4 is a sectional view showing an example of a conventional surface acoustic wave apparatus.
Figure 5:
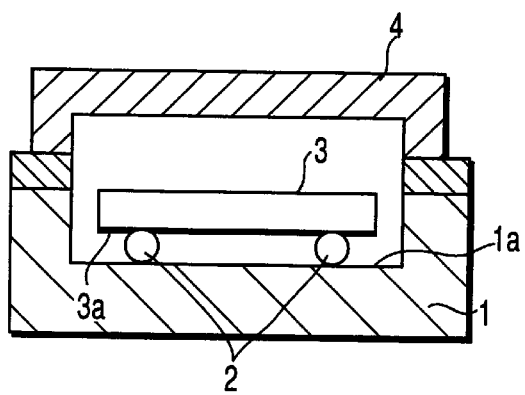
FIG. 5 is a sectional view showing another example of a conventional surface acoustic wave apparatus.
Figure 6:
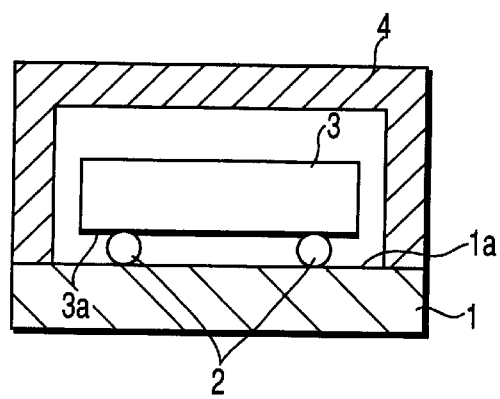
FIG. 6 is a sectional view showing still another example of a conventional surface acoustic wave apparatus.
Figure 7:
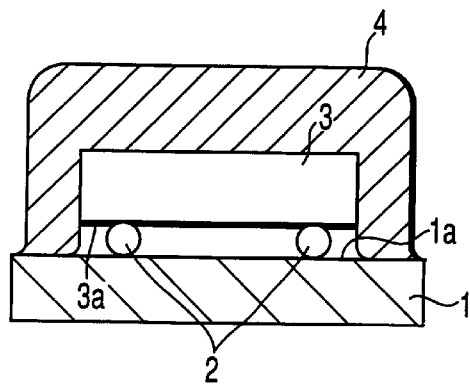
FIG. 7 is a sectional view showing still another example of a conventional surface acoustic wave apparatus.

FIG. 3 shows a modification of the embodiment. Specifically, the wall section 26 of the base 21 has an integral structure composed of a rising section 26b raised from the base body 21a and a frame member 21b stacked on the rising section 26b.

This configuration also produces a similar effect to that of the embodiment shown in FIGS. 1 and 2. The entire wall section 26 may be formed integrally with the base body 21a. In this case, the preparation of several types of base 21 according to the rising height of the wall 26a enables plural types of surface acoustic wave apparatuses to be coped with.

The present invention is not limited to the above embodiment and may be practiced or embodied in still other ways without departing from the spirit or essential character thereof.

What is claimed is:

1. A surface acoustic wave apparatus comprising:

a surface acoustic wave element;

a ceramic base having a mounting surface on which the surface acoustic wave element is mounted;

a ceramic frame body joined to said ceramic base and having a side wall which surrounds, in a state of having a clearance, sides of said surface acoustic wave element mounted on the mounting surface;

metallized wiring formed on said ceramic base and electrically connected to said surface acoustic wave element mounted on said mounting surface, said metallized wiring passing between said ceramic base and said frame body to a region outside said side wall; and a cap joined to the ceramic frame body opposite said ceramic base and covering said surface acoustic wave element, wherein a height of the side wall is set at about 50–280 $\mu$m lower than a highest part of said surface acoustic wave element mounted on said mounting surface, and a side portion of said surface acoustic wave element exposed over said side wall is configured to engage with a test device.

2. The surface acoustic wave apparatus according to claim 1, wherein:

said ceramic base comprises a substantially flat base body with said mounting surface on which said surface acoustic wave element is mounted; and said ceramic frame body is disposed on the mounting surface of the substantially flat base body surrounding said surface acoustic wave element.

3. The surface acoustic wave apparatus according to claim 1, wherein said ceramic frame body comprises stacked plural frame body layers.

4. The surface acoustic wave apparatus according to claim 1, wherein said cap is joined to the ceramic frame body, thereby housing said surface acoustic wave element.

5. The surface acoustic wave apparatus according to claim 1, wherein the difference in height between the height of the side wall and the highest part of said surface acoustic wave element mounted on the mounting surface of said ceramic base is about 50 $\mu$m or more.

6. The surface acoustic wave apparatus according to claim 1, wherein said surface acoustic wave element comprises an electrode pattern formed on a surface facing the mounting surface of said ceramic base.

7. The surface acoustic wave apparatus according to claim 6, wherein the electrode pattern of said surface acoustic wave element is connected electrically to the mounting surface of said ceramic base via conductive bumps.

8. A method of manufacturing surface acoustic wave apparatuses, comprising the step of, when a cap is jointed to a base having a mounting surface on which a surface acoustic wave element is mounted and a side wall surrounding said surface acoustic wave element mounted on the mounting surface in such a manner that it covers said surface acoustic wave element, making the side wall of said base lower than the highest part of said surface acoustic wave element.

9. The method of manufacturing surface acoustic wave apparatuses according to claim 8, characterized in that said base is composed of an almost flat-plate-like base body with a mounting surface on which said surface acoustic wave element is mounted and a frame member so provided on the mounting surface of the base body that plural frame member layers are stacked so as to surround said surface acoustic wave element and that the height of the side wall of said base is set by stacking said frame member layers.

10. The method of manufacturing surface acoustic wave apparatuses according to claim 8 or 9, characterized in that, when said cap is joined to said base, the positioning is done using the portions projecting from the side wall of said base as a guide.

* * * * *